United States Patent
Hsu et al.

(10) Patent No.: US 8,164,974 B2
(45) Date of Patent: Apr. 24, 2012

(54) MEMORY CIRCUITS, SYSTEMS, AND METHOD OF INTERLEAVING ACCESSES THEREOF

(75) Inventors: Kuoyuan Hsu, San Jose, CA (US);
Ming-Chieh Huang, San Jose, CA (US);
Young Suk Kim, Fremont, CA (US);
Subramani Kengeri, San Jose, CA (US)

(73) Assignee: Taiwan Semiconductor Manufacturing Company, Ltd.

( * ) Notice: Subject to any disclaimer, the term of this patent is extended or adjusted under 35 U.S.C. 154(b) by 187 days.

(21) Appl. No.: 12/698,423

(22) Filed: Feb. 2, 2010

(65) Prior Publication Data

US 2010/0214857 A1    Aug. 26, 2010

Related U.S. Application Data

(60) Provisional application No. 61/154,963, filed on Feb. 24, 2009.

(51) Int. Cl.
*G11C 11/00* (2006.01)

(52) U.S. Cl. ............ 365/233.17; 365/189.15; 365/233.1

(58) Field of Classification Search ............. 365/189.15, 365/230.03, 233.1, 233.17, 233.5
See application file for complete search history.

(56) References Cited

U.S. PATENT DOCUMENTS 7,289,385 B2 * 10/2007 Kwak .................. 365/230.03
RE42,976 E * 11/2011 Ahn et al. .................. 365/222

* cited by examiner

*Primary Examiner* — VanThu Nguyen
(74) *Attorney, Agent, or Firm* — Lowe Hauptman Ham & Berner, LLP

(57) ABSTRACT

An interleaved memory circuit includes a first memory bank having a first memory cell. A first local control circuit is coupled with the first memory bank. A second memory bank includes a second memory cell. A second local control circuit is coupled with the second memory bank. An IO block is coupled with the first memory bank and the second memory bank. A global control circuit is coupled with the first and second local control circuits. An interleaving access includes a clock signal having a first cycle and a second cycle for accessing the first memory cell and the second memory cell, respectively, wherein the second cycle is capable of enabling the first local control circuit to trigger a first transition of a first read column select signal RSSL for accessing the first memory cell.

22 Claims, 11 Drawing Sheets

US 8,164,974 B2

MEMORY CIRCUITS, SYSTEMS, AND METHOD OF INTERLEAVING ACCESSES THEREOF

CROSS-REFERENCE TO RELATED APPLICATIONS

The present application claims priority of U.S. Application Ser. No. 61/154,963, filed on Feb. 24, 2009, which is incorporated herein by reference in its entirety.

FIELD

The present disclosure relates generally to the field of semiconductor circuits, and more particularly, to memory circuits, systems, and methods of interleaving accesses thereof.

BACKGROUND

Memory circuits have been used in various applications. Conventionally, memory circuits can include dynamic random access memory (DRAM) and static random access memory (SRAM) circuits. A DRAM circuit includes a plurality of memory cells. For a conventional DRAM in which arrays of capacitive storage memory cells are provided, each memory cell has an access transistor. Data stored in such memory cells is actually a charge stored on a small capacitor. When the data is to be output, the access transistor is activated by a word line (WL) coupled to the gate or control terminal of the transistor. The access transistor can couple the capacitor to a bit line (BL) coupled to a sense amplifier for sensing the voltage of the capacitor.

SUMMARY

In one embodiment, an interleaved memory circuit includes a first memory bank having a first memory cell. A first local control circuit is coupled with the first memory bank. A second memory bank includes a second memory cell. A second local control circuit is coupled with the second memory bank. An IO block is coupled with the first memory bank and the second memory bank. A global control circuit is coupled with the first and second local control circuits. An interleaving access is generated by a clock signal having a first cycle and a second cycle for accessing the first memory cell and the second memory cell, respectively, wherein the second cycle is capable of enabling the first local control circuit to trigger a first transition of a first read column select signal RSSL for accessing the first memory cell.

In another embodiment, a system includes a processor coupled with an interleaved memory circuit. The memory circuit includes a first memory bank having a first memory cell. A first local control circuit is coupled with the first memory bank. A second memory bank includes a second memory cell. A second local control circuit is coupled with the second memory bank. An IO block is coupled with the first memory bank and the second memory bank. A global control circuit is coupled with the first and second local control circuits. An interleaving access is generated by a clock signal having a first cycle and a second cycle for accessing the first memory cell and the second memory cell, respectively, wherein the second cycle is capable of enabling the first local control circuit to trigger a first transition of a first read column select signal RSSL for accessing the first memory cell.

In the other embodiment, method of interleaving accessing a memory circuit includes receiving a clock signal having a first cycle and a second cycle for accessing a first memory cell of a first memory bank and a second memory cell of a second memory bank of the memory circuit, respectively. A first transition of a first read column select signal RSSL for accessing the first memory cell can be triggered by the second cycle.

These and other embodiments of the present disclosure, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
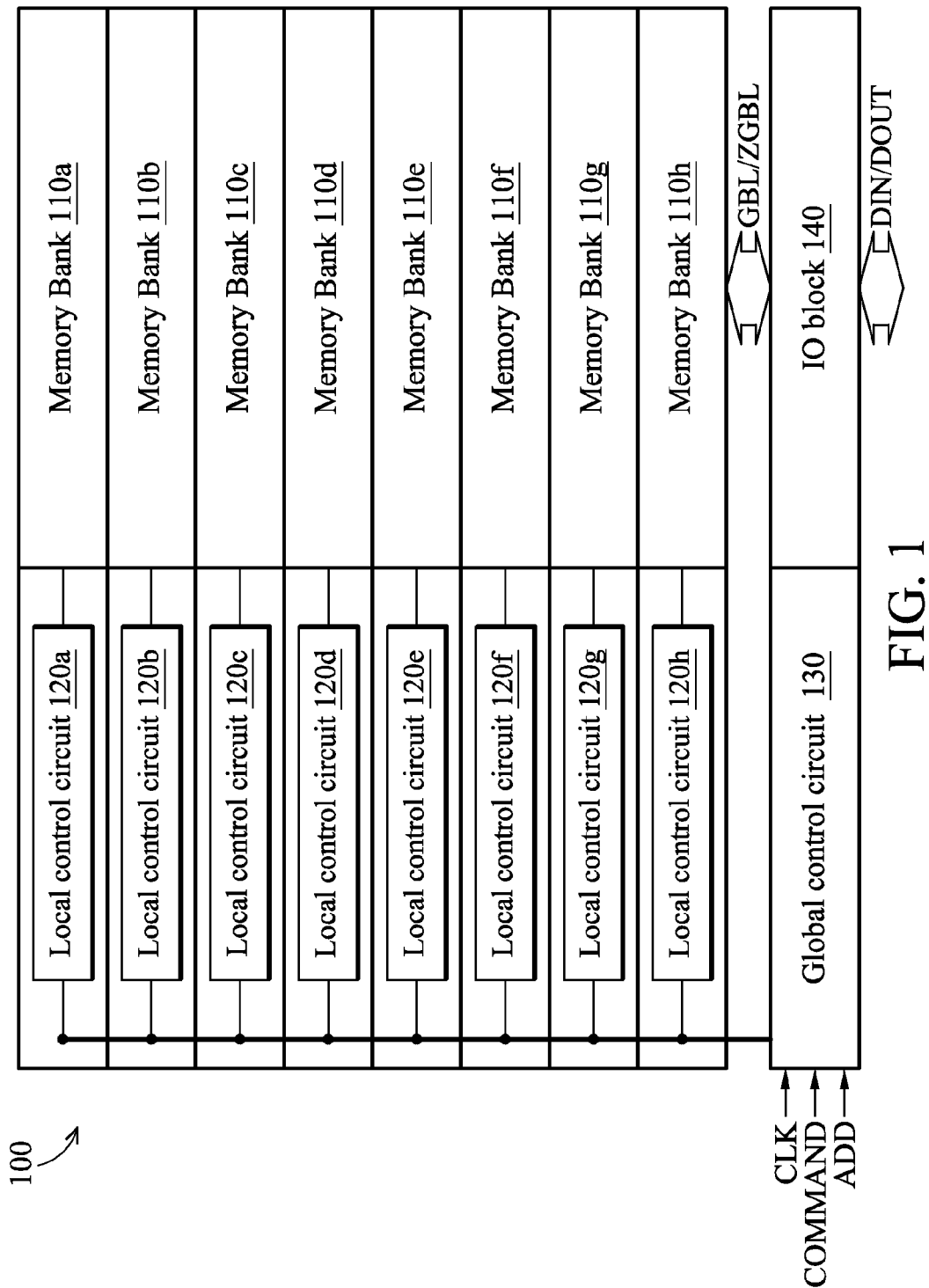
FIG. 1 is a schematic drawing illustrating an exemplary memory circuit.

A conventional DRAM can include a global control circuit coupled with each of memory banks of the memory by a line for read column select signal RSSL and a ling for write column select signal WSSL. For accessing a memory cell of the DRAM, the global control circuit can receive a clock signal CLK, each of cycles of the clock signal CLK can trigger its corresponding read column select signal RSSL and write column select signal WSSL for accessing the memory cell. The global control circuit then forwards the read column select signals RSSL and write column select signals WSSL for accessing memory cells of different memory banks to all of the memory banks. Because all of the read column select signals RSSL and write column select signals WSSL are sent to each of the memory banks, triggering of the read column select signals RSSL for accessing two different memory banks may overlap, resulting in interference between these memory access operations.

Additionally, the conventional memory includes a global bit line GBL and a global bit line bar GBLB that are precharged for accessing data of the memory. It is found that if the speed of the memory is increased, i.e., the cycle time of clock signals is reduced, a time period for precharging the global bit line GBL and the global bit line bar GBLB is reduced such that the precharge time period may not be sufficient to precharge the global bit line GBL and the global bit line bar GBLB for writing data into the memory cells. The situation becomes even worse when a read clock cycle is followed by a write clock cycle.

The conventional memory may need to latch a datum at least three times, e.g., Latency 2, before outputting the sensed datum. As noted above, a word line signal WLS controls enabling or disabling the word line WL coupled with the memory cell. A width of a pulse on the word line signal WLS represents a turn-on time period of the word line WL. A time period between two pulses on the word line signal WLS represent a width of a bit line equalization bar signal BLEQ. Conventionally, the width of the pulse on the word line signal WLS is controlled by an RC time delay generated by a resistance and capacitance of a polysilicon line or layer. It is found that Process-Voltage-Temperature (PVT) variations affect the resistance of the polysilicon, resulting in variations of the width of the pulse of the word line signal WLS which in turns change the width of the bit line equalization bar signal BLEQ.

Based on the foregoing, enhanced memory circuits and accessing methods thereof are desired.

It is understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Embodiments of the disclosure relate to memory circuits, systems, and methods for accessing the memory circuits. The memory circuit receives a clock signal having a first cycle and a second cycle for accessing a first memory cell of a first memory bank and a second memory cell of a second memory bank of the memory circuit, respectively, wherein a first transition of a first read column select signal RSSL for accessing the first memory cell can be triggered by the second cycle. It is noted the phrase "a first transition of a signal directly or indirectly triggers a transition of a second signal" described below means that the transition of the first signal can directly trigger the transition of the second signal or that the transition of the first signal can trigger a transition of a third signal that in turn trigger the transition of the second signal.

FIG. 1 is a schematic drawing illustrating an exemplary memory circuit. In FIG. 1, a memory circuit 100 includes a plurality of memory banks 110a-110h. Each of the memory banks 110a-110h is coupled with a corresponding local control circuit 120a-120h, respectively. A global control circuit 130 is coupled with the local control circuits 120a-120h. An input/output (IO) block 140 is coupled with the memory banks 110a-110h and the global control circuit 130. The IO block 140 communicates with the memory banks 110a-110h via global bit lines GBLs. The IO block 140 also receives data input commands and/or output data stored in the memory banks 110a-110h.

Each of the memory banks 110a-110h includes a memory array including a plurality of word lines and a plurality of bit lines. The memory circuit 100 can be a dynamic random access memory (DRAM) circuit, an embedded DRAM circuit, a static random access memory (SRAM) circuit, an embedded SRAM circuit, a non-volatile memory, e.g., FLASH, EPROM, $E^2$PROME, or other memory circuit.

The global control circuit 130 receives signals such as clock signals (CLK), command signals (Command), address signals (ADD), and/or other signals for accessing memory cells of the memory banks 110a-110h. The command signals can be, for example, chip enable signals (CEB), write enable signals (WEB), and/or other command signals of the memory circuit 100. In embodiments, the global control circuit 130 processes the clock signal CLK and the command signal Command, e.g., a chip enable signal CEB, generating a clock active signal CLK_ACT for the local control circuits 120a-120h. The global control circuit 130 decodes the address signal ADD, forwarding bank address signals BA decoded from the address signal ADD, to designated memory banks corresponding to the bank address signals BA. For example, if the address of the memory cell is in the memory bank 110a, the global control circuit 130 forwards the bank address signal BA (110a) decoded from the address signal to the local control circuit 120a but does not forward the bank address signal BA to other local control circuit 120b-120h.

Figure 2A:
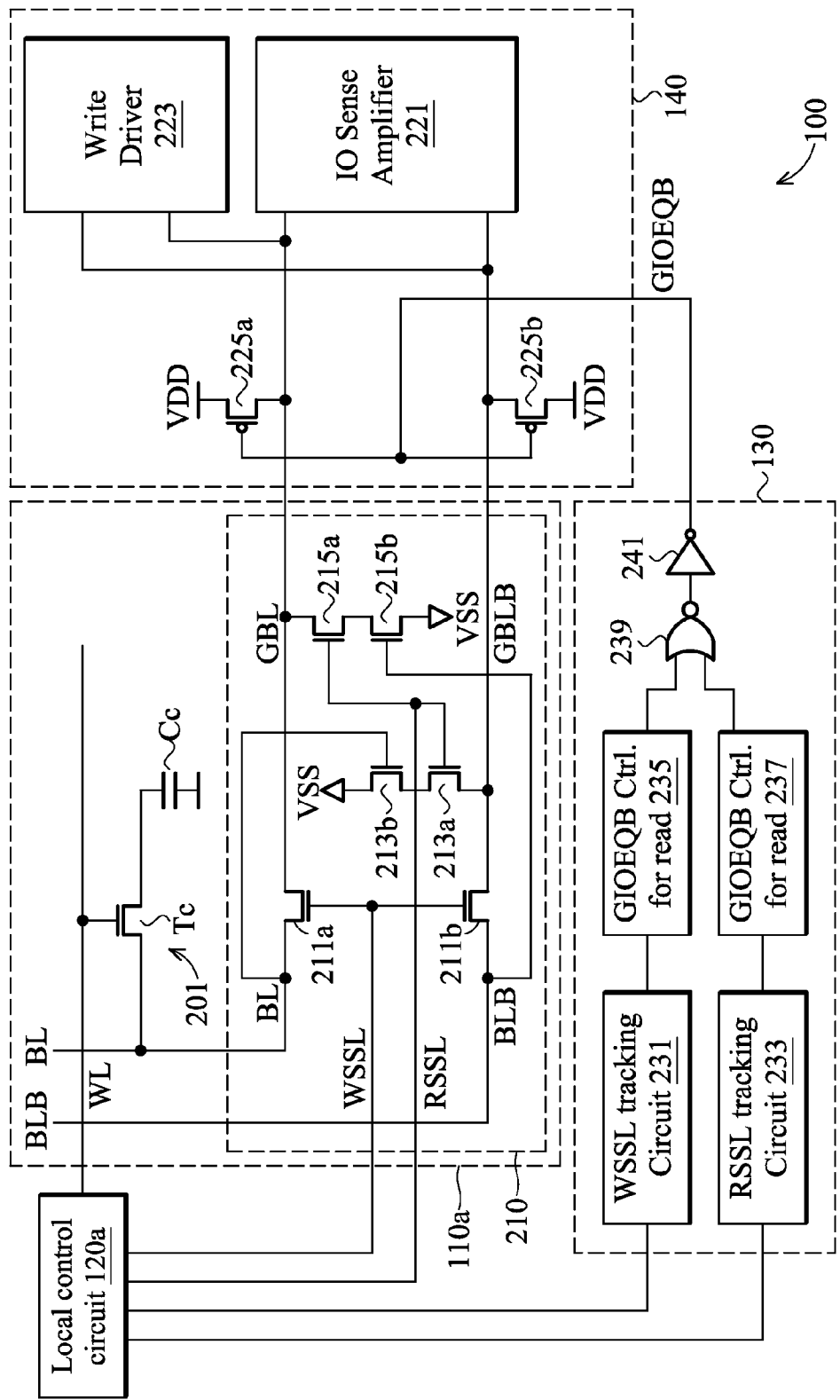
FIG. 2A is a schematic drawing illustrating an exemplary memory circuit including a memory bank, its corresponding local controller, a global control circuit, and an IO block.

FIG. 2A is a schematic drawing illustrating an exemplary memory circuit including a memory bank, its corresponding local controller, a global control circuit, and an IO block. In FIG. 2A, the memory circuit 100 includes the memory bank 110a, the local control circuit 120a, the global control circuit 130, and the IO block 140. The memory bank 110a includes at least one memory cell, e.g., memory cell 201. The memory cell 201 is coupled with a bit line (BL) and a word line (WL) of the memory bank 110a. For embodiments using DRAM cells, the memory cell 201 includes a memory transistor ($T_c$) and a capacitor ($C_c$). The capacitor $C_c$ is capable of storing a charge representative of a datum, e.g., "0" or "1".

The memory bank 110a includes a bit line bar BLB that can be substantially parallel with the bit line BL. Another memory cell (not shown) can be coupled with the bit line bar BLB and the word line WL. It is noted that though only one memory cell 201 is depicted, other memory cells (not shown) can be placed at the intersection of each of a plurality of word lines WLs and the bit lines BLs. A portion of a memory circuit 100 may have 8, 16, 32, 64, 128 or more columns that can be arranged in word widths. In various embodiments, the word lines are laid out substantially orthogonally to the bit lines. In other embodiments, other arrangements of the word lines and bit lines can be provided.

The memory bank 110a includes at least one local sense amplifier 210. The local sense amplifier 210 is capable of sensing a small differential voltages on, for example, the bit line BL with respect to the bit line bar BLB, the differential voltages corresponding to "0" or "1" datum stored in the memory cell 201. In embodiments, the local sense amplifier 210 includes a write column select line through which write column select signals (WSSL) pass to turn on or off write column select transistors 211a and 211b. The write column select line and write column select transistors 211a and 211b are configured to couple the bit line BL and bit line bar BLB with a global bit line GBL and a global bit line bar GBLB, respectively. The local sense amplifier 210 includes a read column select line through which read select column signals (RSSL) pass to turn on or off read column select transistors 213a and 215a. The read column select line and read column select transistors 213a, 213b, 215a, and 215b are configured to transfer read data from bit lines BL/BLB to global bit lines GBL/GBLB, respectively. It is noted that the number and/or type of write column select transistors 211a, 211b and read column select transistors 213a, 213b, 215a, 215b are mere examples. One of skill in the art can modify the number and/or types of the transistors to achieve a desired local sense amplifier.

Referring again to FIG. 2A, the IO block 140 includes an IO sense amplifier 221 coupled with the global bit line GBL and global bit line bar GBLB. The IO sense amplifier 221 is capable of sensing a differential voltage on, for example, the global bit line GBL with respect to the global bit line bar GBLB, the differential voltages corresponding to "0" or "1" datum stored in the memory cell 201. The IO sense amplifier 221 converts these differential voltages to a "0" or "1" for output. The IO block 140 can include a write driver 223 coupled with the global bit line GBL and global bit line bar GBLB. The write driver 223 is capable of receiving a write command, providing power to write a datum "0" or "1" into the memory cell 201. In embodiments, the IO block 140 includes precharge transistors 225a and 225b. The precharge transistors 225a and 225b receive a global IO equalization bar signal (GIOEQB) for precharging the global bit line GBL and global bit line bar GBLB for writing or reading data.

Referring again to FIG. 2A, the global control circuit 130 includes a WSSL tracking circuit 231 and RSSL tracking circuit 233 coupled with the local control circuit 120a. In embodiments, the WSSL tracking circuit 231 and/or the RSSL tracking circuit 233 include gate delay circuits. The WSSL tracking circuit 231 is capable of tracking enable and/or disable times of the write column select signal WSSL. The RSSL tracking circuit 233 is capable of tracking enable and/or disable times of the read column select signal RSSL. The WSSL tracking circuit 231 is coupled with a global bit line equalization bar (GIOEQB) circuit for write 235. The GIOEQB controller for write 235 receives signals from the WSSL tracking circuit 231, outputting a signal via, for example, a logic gate 239 and an inverter 241, as the global IO equalization bar signal GIOEQB to control the precharge transistors 225a and 225b for precharging the global bit line GBL and global bit line bar GBLB for write accesses. The RSSL tracking circuit 233 is coupled with a GIOEQB controller for read 237. The GIOEQB controller for read 237 receives signals from the RSSL tracking circuit 233, outputting a signal via, for example, the logic gate 239 and the inverter 241, as the global IO equalization bar signal GIOEQB to control the precharge transistors 225a and 225b for precharging the global bit line GBL and global bit line bar GBLB for read accesses.

Figure 2B:
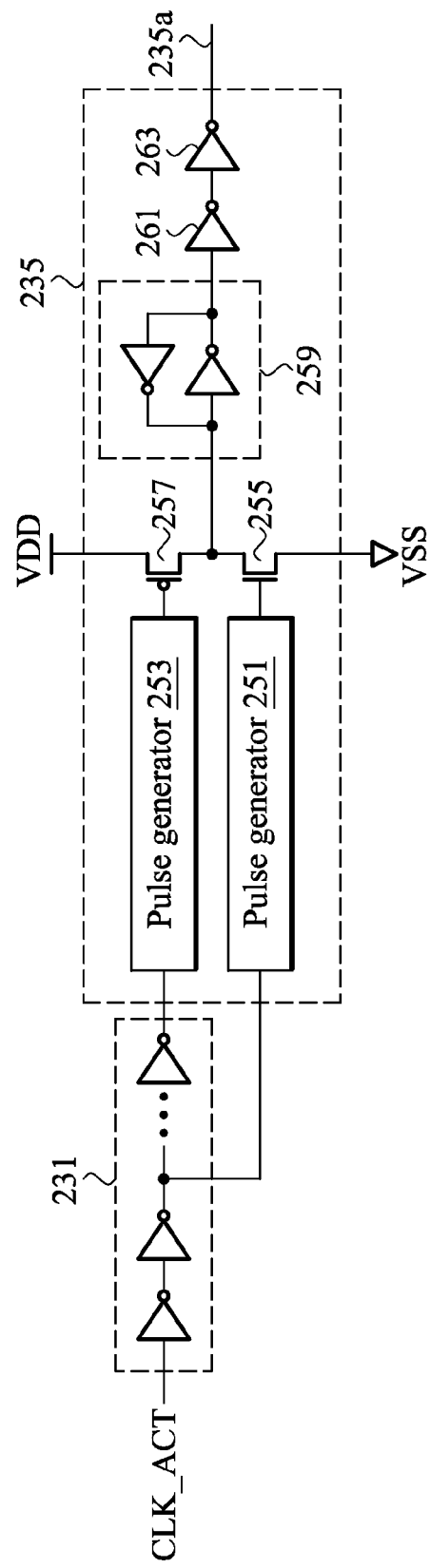
FIG. 2B is a schematic drawing showing an exemplary WSSL tracking circuit coupled with a GIOEQB controller for write.

FIG. 2B is a schematic drawing illustrating a WSSL tracking circuit coupled with a GIOEQB controller for write. In FIG. 2B, the GIOEQB controller for write 235 includes pulse generators 251, 253, transistors 255, 257, a latch circuit 259, and inverters 261, 263. The pulse generators 251, 253 are coupled with the WSSL tracking circuit 231. The pulse generators 251, 253 are coupled with gates of the transistors 255, 257, respectively. Drains of the transistors 255, 257 are coupled with the latch circuit 259 coupled with the inverters 261, 263.

Figure 2C:
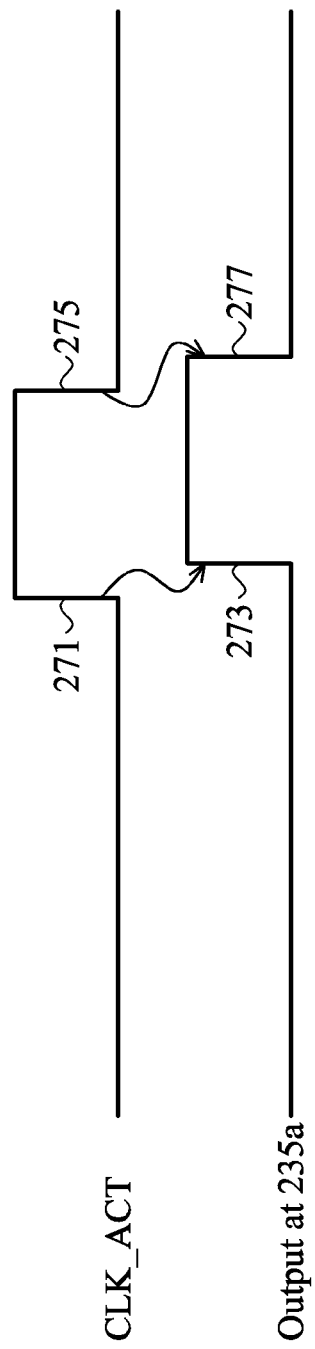
FIG. 2C is a timing diagram illustrating a write column select signal WSSL and a signal at output end of the GIOEQB controller for write.

As noted, in various embodiments the WSSL tracking circuit 231 includes a gate delay circuit. In some embodiments, the WSSL tracking circuit 231 includes a circuit similar to a portion of a series circuit that includes a logic gate 401, an inverter 403, a word line controller 405, a delay circuit 409, a WSSL generator 413 (shown below in FIG. 4), and/or other logic gate. The pulse generator 251 can be coupled with an output that is within the WSSL tracking circuit 231. After tracking a transition 271 (shown in FIG. 2C) of the write column select signal WSSL, the WSSL tracking circuit 231 enable the pulse generator 251 to generate a pulse to turn on the transistor 255, providing a transition 273 of a signal at an output 235a of the WSSL circuit for write 235. The pulse generator 253 is coupled with an output coupled with a last logic gate of the WSSL tracking circuit 231. After tracking a transition 273 (shown in FIG. 2C) of the write column select signal WSSL, the WSSL tracking circuit 231 enables the pulse generator 253 to generate a pulse to turn on the transistor 257, providing a transition 275 of the signal at an output 235a of the WSSL circuit for write 235. The output signal at 235a is output as a global IO equalization bar signal GIOEQB. The GIOEQB controller for read 233 (shown in FIG. 2A) is similar to the GIOEQB controller for write 235.

In embodiments, the RSSL tracking circuit 233 includes a circuit similar to a portion of the series circuit that includes the logic gate 401, the inverter 403, the word line controller 405, the delay circuit 409, another logic gate 415, another inverter 417, a RSSL generator 419 (shown below in FIG. 4), and/or other logic gate. The GIOEQB controller for read 233 (shown in FIG. 2A) is similar to the GIOEQB controller for write 235. It is noted that the number, type, and/or disposition of the pulse generators, transistors, latch circuit, and inverters of the GIOEQB controller for write 235 are mere examples. One of skill in the art is able to modify them to achieve a desired GIOEQB controller for write.

Figure 3:
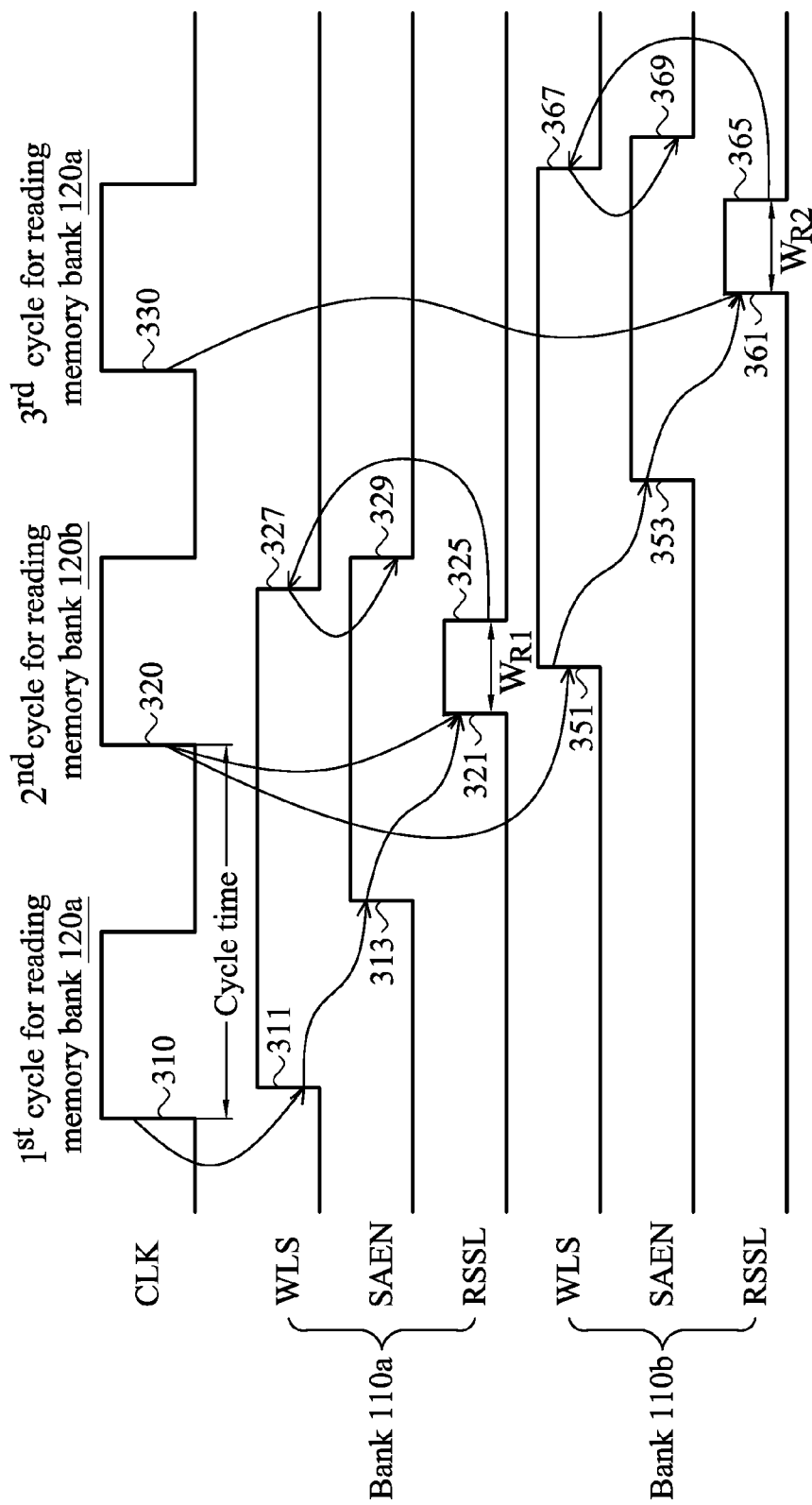
FIG. 3 is a timing diagram of an exemplary interleaving access.

The following descriptions are descriptions regarding an interleaving access of an exemplary memory circuit that is substantially free from interference caused by accessing two cells in different banks. FIG. 3 is a timing diagram of an exemplary interleaving access. In FIG. 3, the clock signal CLK includes a plurality cycles for alternately accessing memory cells in two memory banks, e.g., memory banks 120a and 120b (shown in FIG. 1). As noted above, the global control circuit 130 (shown in FIG. 1) forwards the clock active signal CLK_ACT and the designated bank address signal BA to the corresponding local control circuit 120a and 120b. After processing the signals, each of the local control circuit 120a and 120b outputs word line signals WLS, sense amplifier enable signals SAEN, and column select signals SSL, e.g., read column select signals RSSL and/or write column select signals WSSL.

For embodiments accessing the memory cell 201 of the memory bank 110a, a transition 310 of the $1^{st}$ cycle for accessing the memory bank 110a directly or indirectly triggers a transition 311 from a first state to a second state, e.g., a low state to a high state or enablement, of the word line signal WLS of the memory bank 110a (shown in FIG. 2A). The transition 311 directly or indirectly triggers a transition 313 from a first state to a second state, e.g., a low state to a high state or enablement, of the sense amplifier enable signal SAEN of the memory bank 110a. The transition 313 can be applied to the read column select signal RSSL of the memory bank 110a. It is noted that the transition 313 alone does not trigger a transition 321 of the read column select signal RSSL. The transition 321 can be directly or indirectly triggered by, for example, a transition 320 from a first state to a second state, e.g., from a low state to a high state or enablement, of the $2^{nd}$ cycle for accessing the memory bank 110b. In embodiments, the transition 321 can be directly or indirectly triggered by processing the transitions 313 and 320. In other embodiments, the transition 321 can be directly or indirectly triggered by processing the transition 320 and other transitions, e.g., transitions 311, 313, and/or other transition of signals for accessing the memory bank 110a.

After a period of time $W_{R1}$, the read column select signal RSSL can transition from a high state to a low state, e.g., a transition 325 or disablement. The transition 325 may directly or indirectly trigger a transition 327, e.g., disablement, of the word line signal WLS of the memory bank 110a. The transition 327 of the word line signal WLS may directly or indirectly trigger a transition 329, e.g., disablement, of the sense amplifier enable signal SAEN of the memory bank 110a.

Referring again to FIG. 3, the transition 320 of the $2^{nd}$ cycle can also directly or indirectly trigger a transition 351 from a first state to a second state, e.g., a low state to a high state or enablement, of a word line signal WLS for accessing a memory cell (not shown) of the memory bank 110b. The transition 351 directly or indirectly triggers a transition 353 from a first state to a second state, e.g., a low state to a high state or enablement, of the sense amplifier enable signal SAEN of the memory bank 110b. The transition 353 can be coupled to the read column select signal RSSL of the memory bank 110b. The transition 353 and a transition 330 of the $3^{rd}$ cycle for accessing another memory cell (not shown) of the memory bank 110a may directly or indirectly trigger a transition 361 of the read column select signal RSSL of the memory bank 110b.

After a period of time $W_{R2}$, the read column select signal RSSL can transition from a high state to a low state, e.g., a transition 365 or disablement. The transition 365 may directly or indirectly trigger a transition 367, e.g., disablement, of the word line signal WLS of the memory bank 110b. The transition 367 of the word line signal WLS may directly or indirectly trigger a transition 369, e.g., disablement, of the sense amplifier enable signal SAEN of the memory bank 110b.

Using the above process the time period $W_{R1}$ of the select column signal RSSL for the memory bank 110a is substantially free from overlap with the time period $W_{R2}$ of the read select column signal RSSL for the memory bank 110b. The separation of the read select column signals RSSL can desirably prevent interfering between signals arriving at the IO sense amplifier 221 (shown in FIG. 2A) that provides signals for output. It is noted that the $2^{nd}$ cycle may directly or indirectly trigger the transition 321 of the read column select signal RSSL for the memory cell 201 (shown in FIG. 2A) of the memory bank 110a and the transition 351 of the word line signal WLS for accessing the memory cell (not shown) of the memory bank 110b. Because operations on the array for accessing memory cells can be overlapped, the clock cycle can be desirably modified to a higher frequency, e.g., 500 MHz or more, to operate the memory circuit 100. It is noted the transitions of signals from high to low or low to high for enablement or disablement, respectively, described above can be exchanged for the convenience of a particular embodiment. The scope of the disclosure is not limited thereto.

Figure 4:
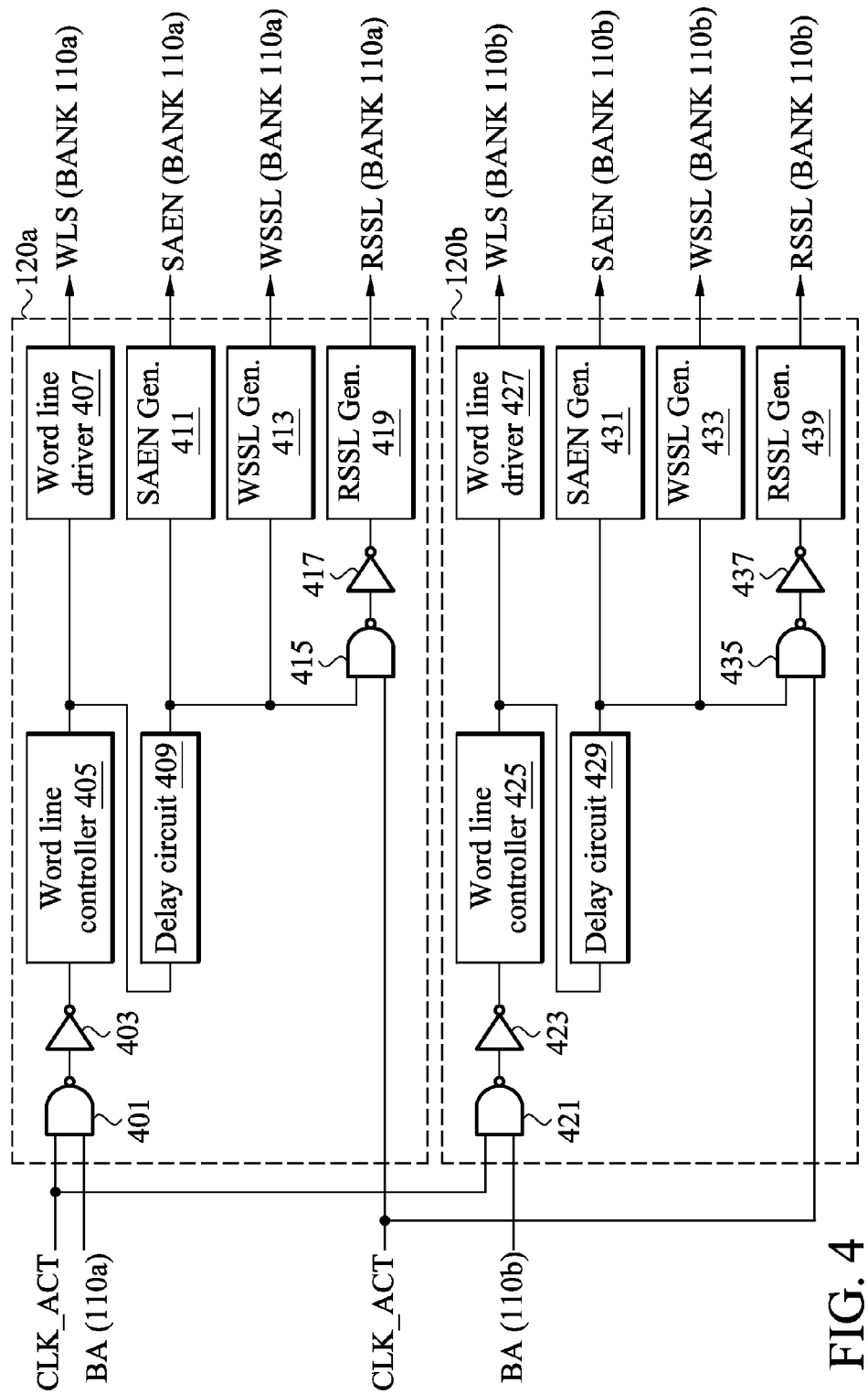
FIG. 4 is a schematic drawing illustrating exemplary local control circuits.

FIG. 4 is a schematic drawing illustrating exemplary local control circuits for implementing the timing diagram of an exemplary interleaving access as shown in FIG. 3. In FIG. 4, the local control circuit 120a includes a first logic gate, e.g., logic gate 401 such as an NAND gate, coupled with a first inverter, e.g., inverter 403. The inverter 403 is coupled with a word line controller 405. The word line controller 405 is coupled with a word line driver 407 and a delay circuit 409. The delay circuit 409 is coupled with a sense amplifier enable (SAEN) generator 411 and a WSSL generator 413. The delay circuit 409 is coupled with a second logic gate, e.g., a logic gate 415 such as an NAND gate, which is coupled with a second inverter, e.g., inverter 417. The inverter 417 is coupled with a RSSL generator 419.

The local control circuit 120b includes a logic gate 421 such as an NAND gate coupled with an inverter 423. The inverter 423 is coupled with a word line controller 425. The word line controller 425 is coupled with a word line driver 427 and a delay circuit 429. The delay circuit 429 is coupled with a sense amplifier enable (SAEN) generator 431 and a WSSL generator 433. The delay circuit 429 is coupled with a logic gate 435, which is coupled with an inverter 437. The inverter 437 is coupled with a RSSL generator 439.

Referring to FIGS. 3 and 4, the logic gate 401 receives and/or performing a logic operations for the clock active CLK_ACT signal and the bank address BA (110a) for the memory bank 110a, outputting a signal to the inverter 403. The inverter 403 inverts the signal, outputting another signal to the word line controller 405. After receiving the signal from the inverter 403, the word line controller 405 outputs a signal to control the word line driver 407 to transition the word line signal WLS from a first state to a second state, for example, the transition 311, to apply a voltage to the word line WL to turn on the memory transistor $T_c$ of the memory cell 201 (shown in FIG. 2A). The output signal of the word line controller 405 is coupled to the delay circuit 409 to delay the transition 311 of the word line signal WLS. The delayed signal is applied to the SAEN generator 411 to transition the sense amplifier enable signal SAEN, e.g., the transition 313 (shown in FIG. 3), to enable the sense amplifier 210 (shown in FIG. 2A). In embodiments for writing a datum into the memory cell 201, the delayed signal from the delay circuit 409 is applied to the WSSL generator 413 to transition the write column select signal WSSL from a first state to a second state, e.g., from a low state to a high state or enablement. The enabled write column select signal WSSL turns on the write column select transistors 211a and 211b (shown in FIG. 2A) to couple the bit line BL and the bit line bar BLB to the global bit line GBL and the global bit line bar GBLB, respectively, such that a voltage from the write driver 223 can write a datum into the memory cell 201. In embodiments for reading a datum stored in the memory cell, the delayed signal from the delay circuit 409 is also be applied to the logic gate 415. The logic gate 415 is also capable of receiving the clock active signal CLK_ACT. The logic gate 415 performs a logic operation for the delayed signal and the clock active signal CLK_ACT. The logic gate 415 outputs a signal to the read column select signal RSSL generator 419 via the inverter 417. Due to the time delay, the read column select signal RSSL generator 419 is does not transitioning the read column select signal RSSL, e.g., the transition 321, until a second pulse (not shown) of the clock active signal CLK_ACT that is directly or indirectly triggered by the transition 320 the $2^{nd}$ cycle of the clock signal CLK for accessing the memory bank 110b occurs. As noted, the $2^{nd}$ cycle of the clock signal CLK for accessing the memory bank 110b is capable of enabling the local control circuit 120a to directly or indirectly to trigger the transition 321 the read column select signal RSSL to read the datum stored in the memory cell 201 of the memory bank 110a. The transition 321 of the read column select signal RSSL for the memory bank 110a turns on the read column select transistors 215a and 215b (shown in FIG. 2A) such that the IO sense amplifier 221 senses the voltage difference on the global bit line GBL and the global bit line bar GBLB to read the datum stored in the memory cell 201. It is noted that the number, type, and disposition of the logic gates, inverters, word line controllers, word line drivers, delay circuits, various generators are mere examples. One of skill in the art can modify them to achieve desired local control circuits.

Figure 5:
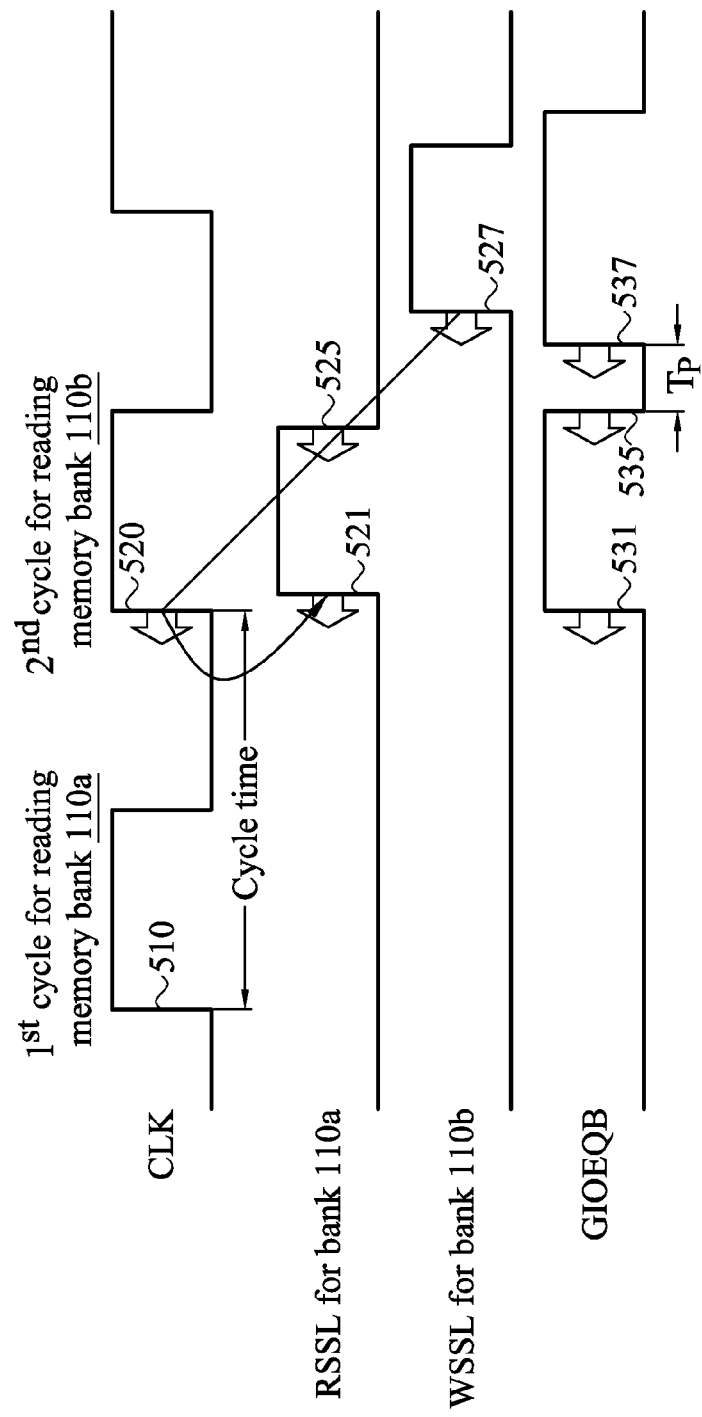
FIG. 5 is a timing diagram showing an exemplary operation having a precharge period for precharging a global bit line and/or a global bit line bar substantially independent from a change of cycle time of clock signals.

FIG. 5 is a timing diagram showing an exemplary operation having a precharge period for precharging a global bit line and/or a global bit line bar substantially independent from a change of a cycle time of clock signals using the circuits shown in FIGS. 1, 2 and 4. In embodiments, an interleaving access has a clock signal CLK including a $1^{st}$ cycle for reading the datum of the memory cell 201 of the memory bank 110a (shown in FIG. 2A) and a $2^{nd}$ cycle for writing a datum to the memory cell (not shown) of the memory bank 110b. As noted, a transition 510 of the 1$^{st}$ cycle of the clock signal CLK directly or indirectly triggers the transition of the word line signal WLS that in turn directly or indirectly triggers the transition of the sense amplifier enable signal SEAN and the transition of the write column select signal WSSL for the memory cell 201 of the memory bank 110a. A transition 520 of the 2$^{nd}$ cycle of the clock signal CLK directly or indirectly triggers a transition 521 of the read column select signal RSSL for the memory cell 201 of the memory bank 110a. The transition 520 of the 2$^{nd}$ cycle of the clock signal CLK also directly or indirectly triggers a transition of the word line signal WLS that in turn directly or indirectly trigger a transition 527 of the sense amplifier enable signal SEAN and a transition 527 of a write column select signal WSSL for the memory cell (not shown) of the memory bank 110b.

Referring to FIGS. 4 and 5, the RSSL tracking circuit 233 and the WSSL tracking circuit 231 are coupled with the clock active signal CLK_ACT and the local control circuits 120a and 120b. The RSSL tracking circuit 233 and the WSSL tracking circuit 231 track the transitions 521, 525 of the read column select signal RSSL for accessing the memory bank 110a and the transition 527 of the write column select signal WSSL for accessing the memory bank 110b, respectively.

As noted, the WSSL tracking circuit 231 and/or the RSSL tracking circuit 233 output signals for providing the global IO equalization bar signal GIOEQB to turn on or turn off the precharge transistors 225a and 225b to enable or disable, respectively, precharging the global bit line GBL and global bit line bar GBLB. In various embodiments, the precharge transistors 225a and 225b are PMOS transistors. For reading data from the memory cell 201 of the memory bank 110a, the precharge of the global bit line GBL and global bit line bar GBLB can be disabled before the bit line BL and the bit line bar BLB are coupled to the global bit line GBL and global bit line bar GBLB, respectively. The coupling of the bit line BL and the bit line bar BLB with the global bit line GBL and global bit line bar GBLB, respectively, is predetermined depending on the transition 521 of the read column select signal RSSL or the transition 527 of the write column select signal WSSL. In embodiments, a transition 531 of the global IO equalization bar signal GIOEQB is determined by the RSSL tracking circuit 233 (shown in FIG. 2A) by tracking the transition 521 of the read column select signal RSSL for reading the memory cell 201 of the memory bank 110a. A transition 537 of the global IO equalization bar signal GIOEQB is determined by the WSSL tracking circuit 231 by tracking the transition 527 of the write column select signal WSSL for writing the memory cell (not shown) of the memory bank 110b.

Referring to FIG. 2A, after the IO sense amplifier 221 senses the voltage difference between the global bit line GBL and the global bit line bar GBLB, a transition 525, e.g., disablement, of the read column select signal RSSL for the memory cell 201 of the memory bank 110a is directly or indirectly triggered. After tracking the transition 525, the RSSL tracking circuit 233 directly or indirectly triggers a transition 535 of the global IO equalization bar signal GIOEQB from a first state to a second state, e.g., a high state to a low state or an enablement, to turn on the precharge transistors 211a and 211b for precharging the global bit line GBL and the global bit line bar GBLB. After a precharge period T$_p$, the global IO equalization bar signal GIOEQB can transition from a first state to a second state, e.g., the transition 537 or disablement, to turn off the precharge transistors 211a and 211b.

In embodiments using a high frequency operation, it is found that if the cycle time of the clock signal CLK is reduced, e.g., the transition 520 shifts towards the transition 510, the transitions 521 and 525 of the read column select signal RSSL and the transition 527 of the write column select signal WSSL can shift corresponding to the shift of the transition 520. As noted, the RSSL tracking circuit 233 and the WSSL tracking circuit 231 (shown in FIG. 2A) track the transitions of the transitions 521 and 525 of the read column select signal RSSL and the transition 527 of the write column select signal WSSL. The global control circuit 130 outputs the global IO equalization bar signal GIOEQB having the transitions 531, 535, and 537 corresponding to the transitions 521, 525, and 527, respectively. The transition 531, 535, and 537 thus shift corresponding to the shift of the transitions 521, 525, and 523, respectively. From the foregoing, a change of the precharge period T$_p$ of the global IO equalization bar signal GIOEQB is substantially independent from a change of the cycle time of the clock signal CLK.

Figure 6:
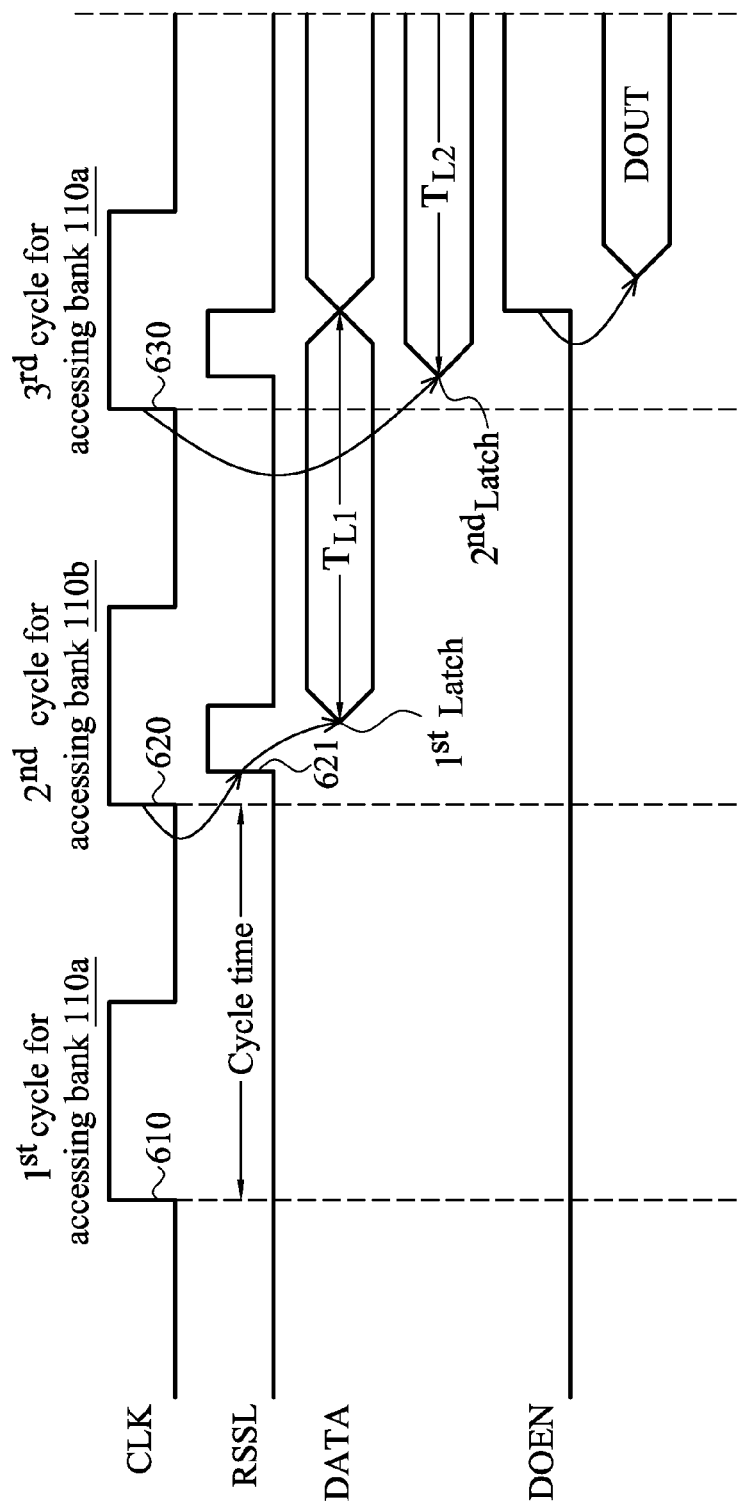
FIG. 6 is a schematic timing diagram showing an exemplary operation for latching data.

FIG. 6 is a schematic timing diagram showing an exemplary operation for latching data. In FIG. 6, transitions 610, 620, and 630 are similar to the transitions 310, 320, and 330 described above in conjunction with FIG. 3. As noted, the transition 620 of the 2$^{nd}$ cycle for accessing the memory cell of the memory bank 110b directly or indirectly triggers a transition 621 of the read column select signal RSSL for accessing the memory cell 201 of the memory bank 110a. The transition 621 directly or indirectly triggers first latching a signal representing voltage difference between the global bit lines GBL and GBLB representing a datum stored in the memory cell 201 of the memory bank 110a. The sensed signal is first latched for a time period T$_{L1}$. During the time period T$_{L1}$, the transition 630 of the 3$^{rd}$ cycle of the clock signal CLK for accessing another memory cell (not shown) of the memory bank 110a directly or indirectly triggers a second latch to latch the first latched signal. The first latched signal can be second latched for a time period T$_{L2}$. During the time period T$_{L2}$, a data out enable signal DOEN can be triggered to transition from a first state to a second state, e.g., from a low state to a high state or enablement, to output the second latched signal representing the stored datum of the memory cell 201.

Figure 7:
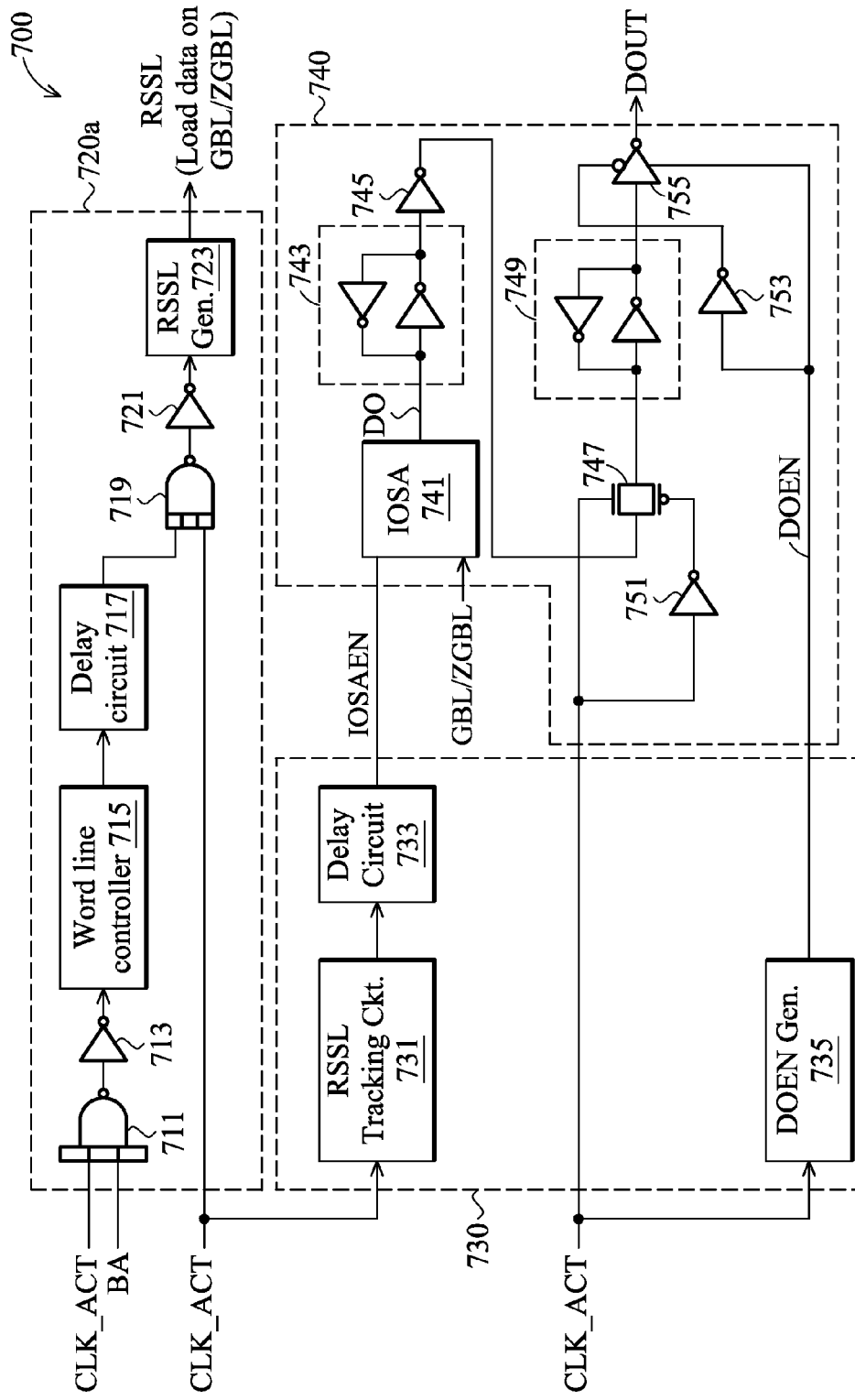
FIG. 7 is a schematic drawing showing an exemplary memory circuit.

FIG. 7 is a schematic drawing showing an exemplary memory circuit for implementing the timing diagram shown in FIG. 6. In FIG. 7, the memory circuit 700 includes a local control circuit 720a, a global control circuit 730, and an IO block 740, which are coupled to each other. The local control circuit 720a includes a logic gate 711, inverter 713, word line controller 715, delay circuit 717, logic gate 719, inverter 721, and RSSL generator 723, which are similar to the logic gate 401, inverter 403, word line controller 405, delay circuit 409, logic gate 415, inverter 417, and RSSL generator 419, respectively, described above in conjunction with FIG. 4.

In embodiments, the global control circuit 730 includes an RSSL tracking circuit 731 coupled with a delay circuit 733. The global control circuit 730 includes a data out enable (DOEN) generator 735 which is coupled with the clock active signal CLK_ACT and the IO block 740. The RSSL tracking circuit 731 is similar to the RSSL tracking circuit 233 described above in conjunction with FIG. 2A. The delay circuit 733 delays the transition 621 of the read column select signal RSSL for reading the datum stored in the memory cell 201 of the memory bank 110a, outputting an IO sense amplifier enable signal IOSAEN to enable or disable an IO sense amplifier (IOSA) 741. The data out enable generator 735 outputs a data out enable signal DOEN to enable or disable output of the IO block 740.

The IO block 740 includes the IO sense amplifier 741 coupled with a first latch circuit 743. The first latch circuit 743 is coupled with an inverter 745. The inverter 745 is coupled with a pass gate 747, which includes two gates coupled with an inverter 751 coupled with the global control circuit 730. The pass gate 747 is coupled with a second latch circuit 749. The second latch circuit 749 is coupled with an inverter 755. The inverter 755 is coupled with an inverter 753 and the data out enable generator 735.

Referring to FIGS. 6 and 7, due to the delay provided by the delay circuit 733 the IO sense amplifier 741 is directly or indirectly triggered by the transition 620 for accessing the memory bank 110b to sense the voltage difference on the global bit line GBL and the global bit line bar GBLB. The IO sense amplifier 741 outputs a sensed signal DO corresponding to the datum stored in the memory cell 201 of the memory bank 110a, which is latched by the first latch circuit 743. The first latched signal is coupled to the inverter 745 to the pass gate 747. The clock active signal CLK_ACT triggered by the transition 630 of the $3^{rd}$ cycle for accessing the memory bank 110a turns on the pass gate 747 such that the second latch circuit 749 can second latch the first latched signal. The second latched signal and the data out enable signal DOEN can control the inverter 755 to output the datum stored in the memory cell 201 of the memory bank 110a. In contrary to the conventional memory circuit having at least three latches for outputting datum, the memory circuit 700 may merely use less latches, e.g., two latches, for outputting data of the memory cells. It is noted that the number, type, configuration of the inverters, latch circuits, pass gate, and/or other circuits are mere examples. One of skill in the art is capable of modifying them to achieve a desired memory circuit.

Figure 8:
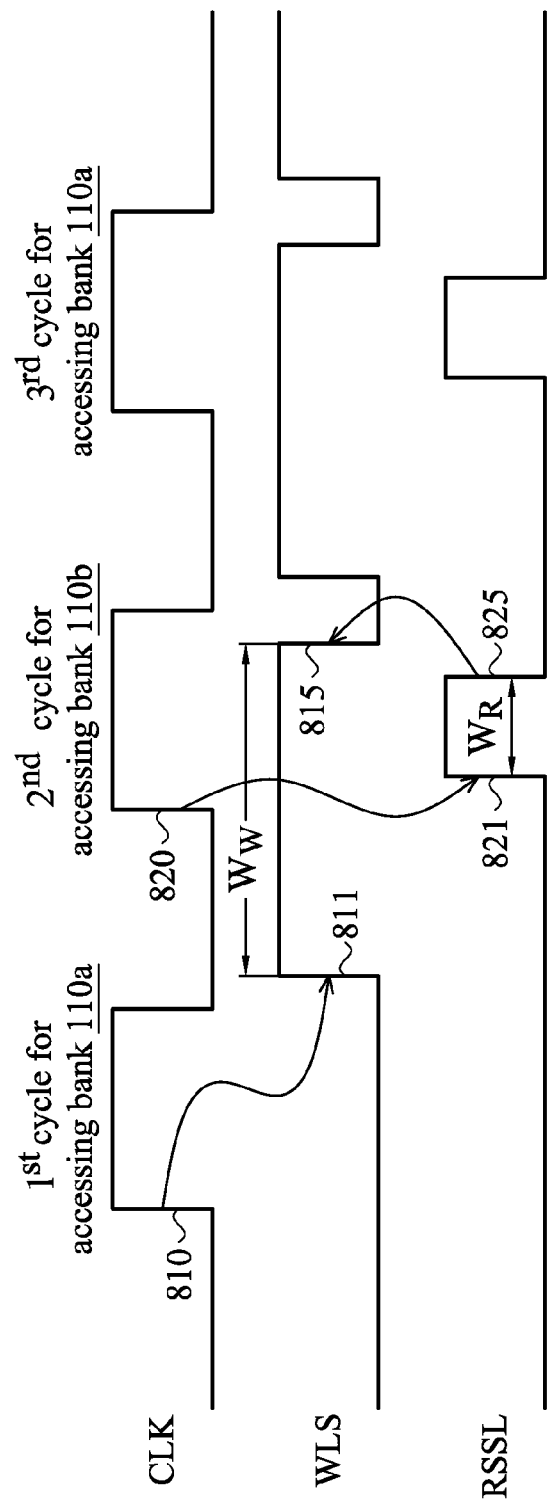
FIG. 8 is a schematic drawing showing an exemplary operation for controlling a pulse width of a word line signal WLS substantially independent from Process-Voltage-Temperature (PVT) variations.

FIG. 8 is a schematic drawing showing an exemplary operation for controlling a pulse width of a word line signal WLS substantially independent from Process-Voltage-Temperature (PVT) variations. In FIG. 8, transitions 810 and 820 are similar to the transitions 310 and 320 described above in conjunction with FIG. 3. As noted, the transition 810 of the $1^{st}$ cycle of the clock signal CLK directly or indirectly triggers a transition 811 of the word line signal WLS for accessing the memory cell 201 of the memory bank 110a. The transition 820 of the $2^{nd}$ cycle of the clock signal CLK directly or indirectly triggers a transition 821 of the read column select signal RSSL for accessing the memory cell 201 of the memory bank 110a. If a voltage difference, e.g., about 100 mV, between the global bit line GBL and the global bit line bar GBLB is sensed, a transition 825 of the read column select signal RSSL is directly or indirectly triggered. A pulse width $W_R$ of the read column select signal RSSL is determined by the transitions 821 and 825.

Referring to FIG. 8, the transition 825 of the read column select signal RSSL directly or indirectly triggers a transition 815 from a first state to a second state, e.g., a high state to a low state or disablement, of the word line signal WLS for accessing the memory cell 201 of the memory bank 110a. The pulse width $W_W$ of the word line signal WLS is determined by the transitions 811 and 815. In contrast to a conventional pulse width of a word line signal generated by an RC time delay, the pulse width $W_W$ of the word line signal WLS is substantially independent of Process-Voltage-Temperature (PVT) variations. The pulse width $W_W$ of the word line signal WLS can be more desirably controlled.

Figure 9:
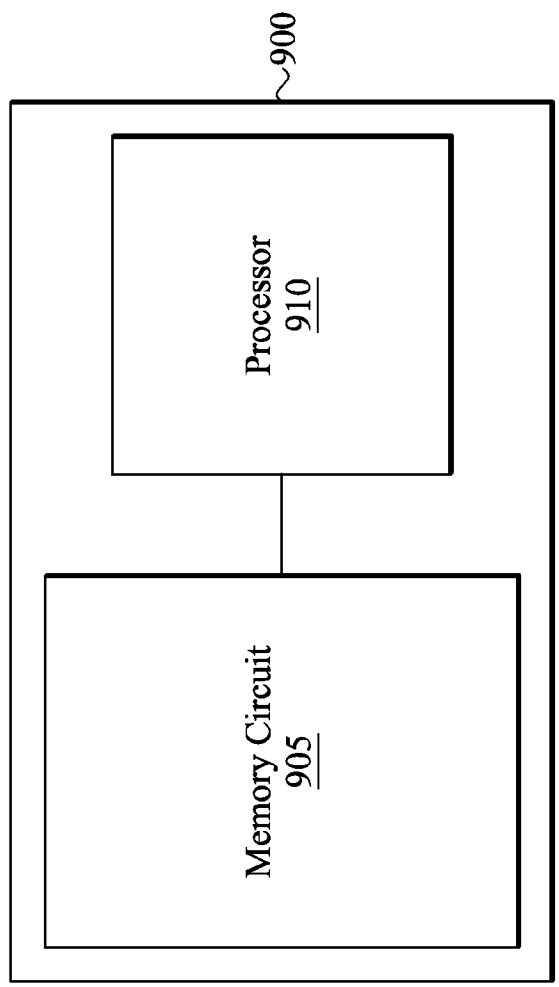
FIG. 9 is a schematic drawing showing a system including an exemplary memory circuit.

FIG. 9 is a schematic drawing showing a system including an exemplary memory circuit. In FIG. 9, a system 900 includes a processor 910 coupled with the memory circuit 905. The memory circuit 905 can be similar to the memory circuit 100 or 700 described above in conjunction with FIGS. 1, 2, and/or 7.

The processor 910 is capable of accessing the datum stored in the memory cell of the memory circuit 905. In embodiments, the processor 910 can be a processing unit, central processing unit, digital signal processor, or other processor that is suitable for accessing data of memory circuit.

In embodiments, the processor 910 and the memory circuit 905 can be formed within a system that can be physically and electrically coupled with a printed wiring board or printed circuit board (PCB) to form an electronic assembly. The electronic assembly can be part of an electronic system such as a computer, wireless communication device, computer-related peripheral, entertainment device, or the like.

In embodiments, the system 900 including the memory circuit 100 can provides an entire system in one integrated circuit (IC), so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interleaved memory circuit comprising:
   a first memory bank including at least one first memory cell for storing a charge representative of a first datum, the first memory cell being coupled with a first word line and a first bit line;
   a first local control circuit coupled with the first memory bank;
   a second memory bank including at least one second memory cell for storing a charge representative of a second datum, the second memory cell being coupled with a second word line and a second bit line;
   a second local control circuit coupled with the second memory bank;
   an IO block coupled with the first memory bank and the second memory bank; and
   a global control circuit coupled with the first and second local control circuits, an interleaving access including a clock signal having a first cycle and a second cycle for accessing the first memory cell and the second memory cell, respectively, wherein the second cycle is capable of enabling the first local control circuit to trigger a first transition of a first read column select signal RSSL for accessing the first memory cell.

2. The memory circuit of claim 1, wherein the second cycle is further capable of enabling the second local control circuit to trigger a transition of a word line signal for controlling the second word line such that the first transition of the first read column select signal RSSL for accessing the first memory cell by the first local control circuit is substantially free from overlapping with a first transition of a second read column select signal RSSL for accessing the second memory cell by the second local control circuit.

3. The memory circuit of claim 1, wherein the second cycle is further capable of enabling the second local control circuit to trigger a transition of a write column select WSSL for accessing the second memory cell such that a change of a precharge period for precharging global bit lines that are capable of being coupled with the first and second bit lines is substantially independent from a change of a cycle time of the first and second cycles.

4. The memory circuit of claim 3, wherein the first transition of the first read column select signal RSSL for accessing the first memory cell is arranged to trigger first latching of a signal representing a voltage difference between the global bit lines representing the first datum of the first memory cell.

5. The memory circuit of claim 4, wherein the first latched signal is capable of being second latched triggered by a third cycle of the clock signal for accessing a third memory cell of the first memory bank, and the second latched signal is capable of being output.

6. The memory circuit of claim 1, wherein the first cycle is capable of enabling the first local control circuit to trigger a first transition of a word line signal for controlling the first word line, a second transition of the first read column select signal RSSL for accessing the first memory cell is arranged to trigger a second transition of the word line signal for controlling the first word line, and the first transition and the second transition of the word line signal for controlling the first word line determine a width of a pulse of the word line signal for controlling the first word line.

7. The memory circuit of claim 1, wherein the first local control circuit comprises:
 a first logic gate capable of receiving the clock signal;
 a first inverter coupled with the first logic gate;
 a word line controller coupled with the first inverter;
 a word line driver coupled with the word line control circuit;
 a first delay circuit coupled with an output end of the word line controller;
 a sense amplifier enable generator coupled with the first delay circuit;
 a write column select generator coupled with the first delay circuit;
 a second logic gate coupled with the first delay circuit;
 a second inverter coupled with the second logic gate; and
 a read column select generator coupled with the second inverter.

8. The memory circuit of claim 7, wherein the global control circuit comprises:
 a word column select signal (WSSL) tracking circuit coupled with the first local control circuit;
 a global IO equalization bar (GIOEQB) controller for write coupled with the WSSL tracking circuit;
 a read column select signal (RSSL) tracking circuit coupled with the first local control circuit;
 a global IO equalization bar (GIOEQB) controller for read coupled with the RSSL tracking circuit;
 a third logic gate coupled with the GIOEQB controller for write and the GIOEQB controller for read; and
 a third inverter coupled with the third logic gate.

9. The memory circuit of claim 8, wherein the global control circuit further comprises:
 an IO sense amplifier coupled with the global control circuit;
 a first latch circuit coupled with the IO sense amplifier;
 a fourth inverter coupled with first latch circuit;
 a pass gate coupled with the fourth inverter;
 a second latch circuit coupled with the pass gate; and
 a fifth inverter coupled with the second latch circuit and the data out enablement circuit.

10. The memory circuit of claim 9, wherein the IO block comprises:
 a second delay circuit coupled with the RSSL tracking circuit; and
 a data out enable generator capable of receiving the clock signal, the data out enable generator being coupled with the IO block.

11. A system comprising:
 a processor; and
 an interleaved memory circuit coupled with the processor, the interleaved memory circuit comprising:
  a first memory bank including at least one first memory cell for storing a charge representative of a first datum, the first memory cell being coupled with a first word line and a first bit line;
  a first local control circuit coupled with the first memory bank;
  a second memory bank including at least one second memory cell for storing a charge representative of a second datum, the second memory cell being coupled with a second word line and a second bit line;
  a second local control circuit coupled with the second memory bank;
  an IO block coupled with the first memory bank and the second memory bank; and
  a global control circuit coupled with the first and second local control circuits, an interleaving access including a clock signal having a first cycle and a second cycle for accessing the first memory cell and the second memory cell, respectively, wherein the second cycle is capable of enabling the first local control circuit to trigger a first transition of a first read column select signal RSSL for accessing the first memory cell.

12. The system of claim 11, wherein the second cycle is further capable of enabling the second local control circuit to trigger a transition of a word line signal for controlling the second word line such that the first transition of the first read column select signal RSSL for accessing the first memory cell by the first local control circuit is substantially free from overlapping with a first transition of a second read column select signal RSSL for accessing the second memory cell by the second local control circuit.

13. The system of claim 11, wherein the second cycle is further capable of enabling the second local control circuit to trigger a transition of a write column select WSSL for accessing the second memory cell such that a change of a precharge period for precharging global bit lines that are capable of being coupled with the first and second bit lines is substantially independent from a change of a cycle time of the first and second cycles.

14. The system of claim 13, wherein the first transition of the first read column select signal RSSL for accessing the first memory cell is arranged to trigger first latching a signal representing a voltage difference between the global bit lines representing the first datum of the first memory cell.

15. The system of claim 14, wherein the first latched signal is capable of being second latched triggered by a third cycle of the clock signal for accessing a third memory cell of the first memory bank, and the second latched signal is capable of being output.

16. The system of claim 11, wherein the first cycle is capable of enabling the first local control circuit to trigger a first transition of a word line signal for controlling the first word line, a second transition of the first read column select signal RSSL for accessing the first memory cell is arranged to trigger a second transition of the word line signal for controlling the first word line, and the first transition and the second transition of the word line signal for controlling the first word line determine a width of a pulse of the word line signal for controlling the first word line.

17. A method of interleaving accessing a memory circuit comprising:
receiving a clock signal having a first cycle and a second cycle for accessing a first memory cell of a first memory bank and a second memory cell of a second memory bank of the memory circuit, respectively; and
triggering a first transition of a first read column select signal RSSL for accessing the first memory cell by the second cycle.

18. The method of claim 17 further comprising:
triggering a transition of a word line signal for controlling the second memory cell by the second cycle such that the first transition of the first read column select signal RSSL for accessing the first memory cell is substantially free from overlapping with a first transition of a second read column select signal RSSL for accessing the second memory cell.

19. The method of claim 17 further comprising:
triggering a transition of a write column select WSSL for accessing the second memory cell by the second cycle such that a change of a precharge period for precharging global bit lines is substantially independent from a change of a cycle time of the first and second cycles.

20. The method of claim 19 further comprising:
first latching a signal representing a voltage difference between the global bit lines representing a datum stored in the first memory cell, wherein the first latch is capable of being triggered by the first transition of the first read column select signal RSSL for accessing the first memory cell.

21. The method of claim 20 further comprising:
second latching the first latched signal, wherein the second latch can be triggered by a third cycle of the clock signal for accessing a third memory cell of the first memory bank, and the second latched signal is capable of being output.

22. The method of claim 17 further comprising:
triggering a first transition of a word line signal for controlling the first word line by the first cycle; and
triggering a second transition of the word line signal for controlling the first word line by a second transition of the first read column select signal RSSL for accessing the first memory cell, wherein the first transition and the second transition of the word line signal for controlling the first word line determine a width of a pulse of the word line signal for controlling the first word line.

* * * * *